(12) United States Patent
Williams

(10) Patent No.: US 11,281,960 B2
(45) Date of Patent: Mar. 22, 2022

(54) PLEAT COUNTER

(71) Applicant: K&N Engineering, Inc., Riverside, CA (US)

(72) Inventor: Steve Williams, Cherry Valley, CA (US)

(73) Assignee: K&N Engineering, Inc., Riverside, CA (US)

( * ) Notice: Subject to any disclaimer, the term of this patent is extended or adjusted under 35 U.S.C. 154(b) by 49 days.

(21) Appl. No.: 16/664,709

(22) Filed: Oct. 25, 2019

(65) Prior Publication Data

US 2020/0132506 A1 Apr. 30, 2020

Related U.S. Application Data

(60) Provisional application No. 62/751,189, filed on Oct. 26, 2018.

(51) Int. Cl.
| | |
|---|---|
| *G06M 1/00* | (2006.01) |
| *G06M 7/06* | (2006.01) |
| *H03K 21/00* | (2006.01) |
| *G01D 5/00* | (2006.01) |

(52) U.S. Cl.
CPC ............. *G06M 7/06* (2013.01); *G01D 5/00* (2013.01); *G06M 1/00* (2013.01); *H03K 21/00* (2013.01); *G06M 2207/02* (2013.01)

(58) Field of Classification Search
CPC ...... G06M 1/00; G06M 1/02; G06M 2207/00; G06M 2207/02; G06M 7/00; G06M 7/06
USPC ............................................. 377/3, 19
See application file for complete search history.

(56) References Cited

U.S. PATENT DOCUMENTS

| | | | | |
|---|---|---|---|---|
| 3,234,360 | A * | 2/1966 | Schooley, Jr. | G06M 1/10 377/3 |
| 3,732,046 | A * | 5/1973 | Martin | B29C 49/0021 425/140 |
| 3,935,997 | A * | 2/1976 | Loje | D06H 3/00 235/98 C |
| 6,091,792 | A * | 7/2000 | Hill | G06M 9/00 250/222.1 |
| 2020/0254710 | A1 * | 8/2020 | Fiello | B31D 5/0082 |

* cited by examiner

*Primary Examiner* — William Hernandez
(74) *Attorney, Agent, or Firm* — Rutan & Tucker LLP; Hani Z. Sayed

(57) ABSTRACT

A pleat counter and methods are provided to accurately count the number of pleats in a corrugated sheet of material to be used for the production of air filters. The pleat counter comprises a pleat detector mounted underneath a mounting board for counting the pleats. The mounting board is configured to position the pleat detector adjacent to the corrugated sheet of filter material. The pleat detector includes one or more sensors configured to detect the presence of individual pleats comprising the corrugated sheet. The pleat counter includes an interface configured to enable coupling the pleat counter with a data processing system. The data processing system may comprise any of a desktop, a tablet, a server, a mobile phone, a media player, a personal digital assistant (PDA), a personal communicator, a network router or hub, a wireless access point (AP) or repeater, a set-top box, or a combination thereof.

18 Claims, 5 Drawing Sheets

PLEAT COUNTER

PRIORITY

This application claims the benefit of and priority to U.S. Provisional Application, entitled "Pleat Counter," filed on Oct. 26, 2018 and having application Ser. No. 62/751,189.

FIELD

Embodiments of the present disclosure generally relate to the field of counting of corrugations in a material. More specifically, embodiments of the disclosure relate to a pleat counter and methods for accurately counting a number of pleats in a corrugated sheet of material to be used for the production of air filters.

BACKGROUND

An air filter designed to remove particulate matter from an airstream generally is a device comprising fibrous materials. These fibrous materials may remove solid particulates such as dust, pollen, mold, and bacteria from the airstream. Air filters are used in applications where air quality is important, notably in building ventilation systems and with engines.

Air filters may be used in automobiles, trucks, tractors, locomotives and other vehicles that use internal combustion engines. Air filters may be used with gasoline engines, diesel engines, or other engines that utilize fossil fuels or other combustible substances. Air filters may be used with engines in which combustion is intermittent, such as four-stroke and two-stroke piston engines, as well as other types of engines that take in air continuously so that a combustible substance may be burned. For example, air filters may be used with some gas turbines. Filters may also be used with air compressors or in other devices that take in air.

Filters may be made from pleated paper, foam, cotton, spun fiberglass, or other known filter materials. Generally, the air filters used with internal combustion engines and compressors tend to be comprised of either: paper, foam, or cotton filters. Air filters for internal combustion engines prevent abrasive particulate matter from entering the engine's cylinders, where it would cause mechanical wear and oil contamination. In many fuel injected engines, a flat panel pleated paper filter element may be used.

Air filters may be manufactured from a continuous roll of pleated material. It is essential that assembled air filters have a predetermined number of pleats. For example, suppose an air filter is to be tapered. A manufacturer may calculate the number of pleats needed by taking into consideration the size of the air filter and the height of the pleat. A piece of material that includes the desired number of pleats may be cut from the roll. Once cut, the piece of material may be joined at its ends to form a sleeve which is then formed into a filter medium of the air filter.

Along an assembly line, the desired number of pleats generally is counted manually and marked at each interval where the desired number repeats on the roll. As will be appreciated, manually counting pleats not only is time consuming, but is also subject to error. The likelihood of such errors generally is increased by the tedious nature of the job. If the number of pleats is improperly counted, a faulty air filter will result. A need exists, therefore, for a pleat counter that accurately counts the number of pleats in a corrugated sheet of material to be used for the production of air filters.

SUMMARY

A pleat counter and methods are provided for accurately counting a number of pleats comprising a corrugated sheet of material to be used for the production of air filters. The pleat counter comprises a pleat detector mounted underneath a mounting board for counting the pleats while the corrugated sheet of filter material is steadily translated nearby the pleat detector. The mounting board is configured to position the pleat detector adjacent to the corrugated sheet of filter material. The pleat detector includes one or more sensors configured to detect the presence of individual pleats comprising the corrugated sheet. The pleat counter includes an interface configured to couple the pleat counter with a data processing system. The data processing system may comprise any of a desktop, a tablet, a server, a mobile phone, a media player, a personal digital assistant (PDA), a personal communicator, a network router or hub, a wireless access point (AP) or repeater, a set-top box, or a combination thereof.

In an exemplary embodiment, a pleat counter comprises: a mounting board for supporting one or more sensors; a pleat detector for counting a number of pleats comprising a corrugated sheet of filter material; and an interface for coupling the pleat counter with a data processing system.

In another exemplary embodiment, the pleat detector is mounted underneath the mounting board for the purpose of counting the number of pleats comprising the corrugated sheet of filter material. In another exemplary embodiment, the mounting board is configured to position the pleat detector adjacent to the corrugated sheet of filter material. In another exemplary embodiment, the pleat counter is configured to remain in a stationary disposition while the corrugated sheet of filter material is steadily translated nearby the pleat detector, such that the pleats passing by the detector are detectable.

In another exemplary embodiment, the data processing system comprises any of a desktop, a tablet, a server, a mobile phone, a media player, a personal digital assistant, a personal communicator, a network router or hub, a wireless access point or repeater, a set-top box, or a combination thereof. In another exemplary embodiment, wiring and one or more circuit boards are configured to communicate electrical signals between the interface and the pleat detector. In another exemplary embodiment, the one or more circuit boards are configured to translate the electrical signals provided by the pleat detector into signals that are recognizable by the data processing system.

In another exemplary embodiment, the pleat detector includes one or more sensors configured to detect the presence of individual corrugations comprising a corrugated sheet of filter material. In another exemplary embodiment, the one or more sensors comprise any type of sensor capable of detecting the individual corrugations. In another exemplary embodiment, the one or more sensors may be orientated in a variety of configurations suitable for detecting the individual corrugations.

In an exemplary embodiment, a method for a pleat counter comprises: obtaining a mounting board configured to support one or more sensors; configuring a pleat detector for counting a number of pleats comprising a corrugated sheet of filter material; mounting the pleat detector onto the mounting board; coupling a data processing system with the pleat counter; and translating a corrugated filter material nearby the pleat counter.

In another exemplary embodiment, coupling includes providing the data processing system in the form of any of a desktop, a tablet, a server, a mobile phone, a media player, a personal digital assistant, a personal communicator, a network router or hub, a wireless access point or repeater, a set-top box, or a combination thereof. In another exemplary embodiment, coupling includes configuring wiring and one or more circuit boards to communicate electrical signals between the pleat detector and an interface connected to the data processing system. In another exemplary embodiment, configuring the one or more circuit boards includes translating the electrical signals provided by the pleat detector into signals that are recognizable by the data processing system.

In another exemplary embodiment, configuring the pleat detector includes configuring one or more sensors to detect the presence of individual corrugations comprising the corrugated sheet of filter material. In another exemplary embodiment, mounting the pleat detector includes orientating the one or more sensors in a configuration suitable for detecting the individual corrugations. In another exemplary embodiment, mounting the pleat detector includes mounting the pleat counter underneath the mounting board for the purpose of counting a number of pleats comprising a corrugated sheet of filter material. In another exemplary embodiment, translating the corrugated filter material includes configuring the pleat counter to remain in a stationary disposition while the corrugated sheet of filter material passes by the pleat detector.

BRIEF DESCRIPTION OF THE DRAWINGS

The drawings refer to embodiments of the present disclosure in which.

Figure 1:
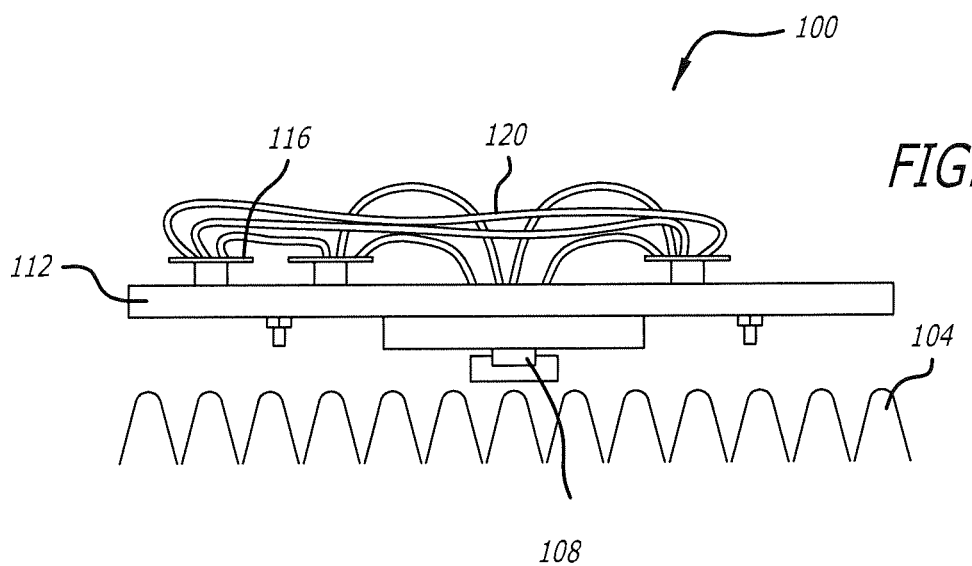
FIG. 1 illustrates an exemplary embodiment of a pleat counter disposed adjacent to a corrugated sheet of filter material.

While the present disclosure is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the present disclosure.

DETAILED DESCRIPTION

In the following description, numerous specific details are set forth in order to provide a thorough understanding of the present disclosure. It will be apparent, however, to one of ordinary skill in the art that the invention disclosed herein may be practiced without these specific details. In other instances, specific numeric references such as "first pleat," may be made. However, the specific numeric reference should not be interpreted as a literal sequential order but rather interpreted that the "first pleat" is different than a "second pleat." Thus, the specific details set forth are merely exemplary. The specific details may be varied from and still be contemplated to be within the spirit and scope of the present disclosure. The term "coupled" is defined as meaning connected either directly to the component or indirectly to the component through another component. Further, as used herein, the terms "about," "approximately," or "substantially" for any numerical values or ranges indicate a suitable dimensional tolerance that allows the part or collection of components to function for its intended purpose as described herein.

Air filters may be manufactured from a continuous roll of pleated material. It is essential that assembled air filters have a predetermined number of pleats. Along an assembly line, the desired number of pleats may be counted and marked at each interval where the desired number of pleats repeats along the roll. Manually counting pleats is time consuming prone to error. If the number of pleats is improperly counted, a faulty air filter will result. Embodiments presented herein below provide a pleat counter capable of accurately counting a desired number of pleats in a corrugated sheet of filter material.

Figure 3:
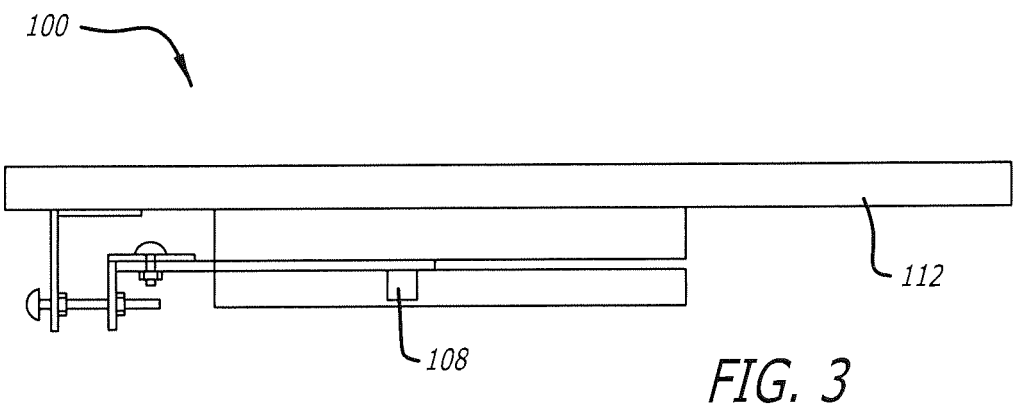
FIG. 3 illustrates a dimensioned front view of the pleat counter of FIG. 1.

FIG. 1 illustrates an exemplary embodiment of a pleat counter 100 disposed adjacent to a corrugated sheet of filter material 104. The pleat counter 100 comprises a pleat detector 108 mounted underneath a mounting board 112, as shown in FIG. 3, for the purpose of counting the pleats comprising the sheet 104. In some embodiments, the pleat counter 100 may be placed in a stationary disposition while the sheet 104 is steadily translated nearby the pleat detector 108, such that the pleats passing by the detector 108 are detectable.

Figure 2:
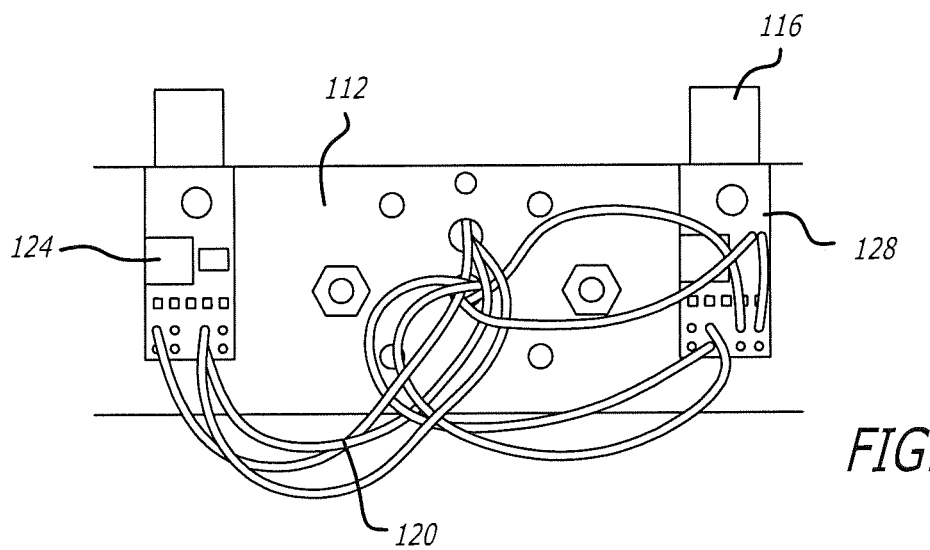
FIG. 2 illustrates a top view of the pleat counter of FIG. 1, including an exemplary embodiment of circuit boards disposed atop a mounting board comprising the pleat counter.
Figure 9:
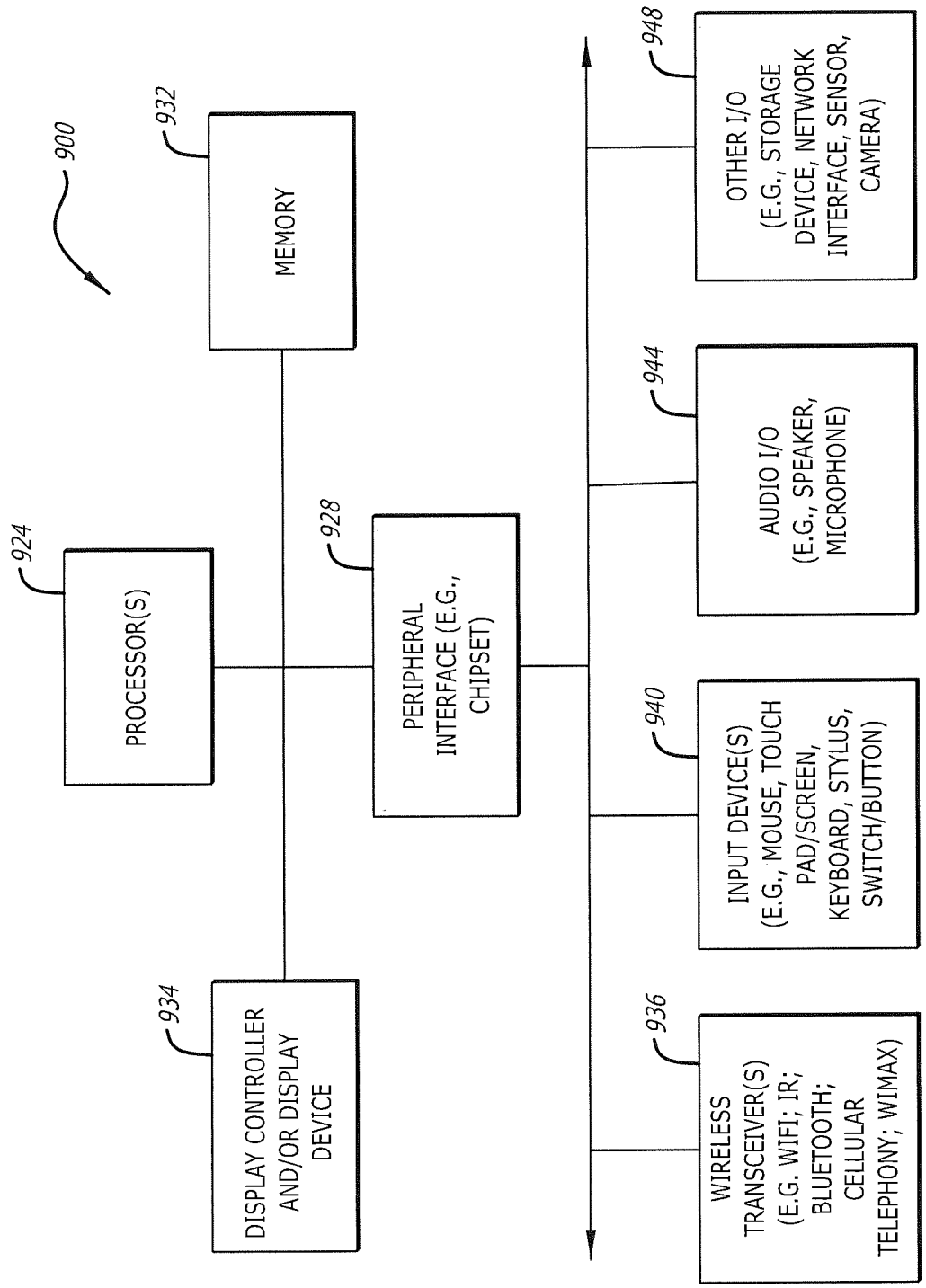
FIG. 9 is a block diagram illustrating an exemplary data processing system that may be used with an automated pleat counter according to the present disclosure.

As shown in FIG. 1, the pleat counter 100 includes an interface 116 that is configured to enable coupling the pleat counter with a data processing system (see FIG. 9). The system may comprise any of a desktop, a tablet, a server, a mobile phone, a media player, a personal digital assistant (PDA), a personal communicator, a network router or hub, a wireless access point (AP) or repeater, a set-top box, or a combination thereof. As shown in FIG. 2, wiring 120 and circuit boards 124, 128 communicate electrical signals between the interface 116 and the pleat detector 108. As will be recognized by those skilled in the art, the circuit boards 124, 128 are configured to translate the electrical signals provided by the pleat detector 108 into signals that are recognizable by the data processing system.

Figure 4:
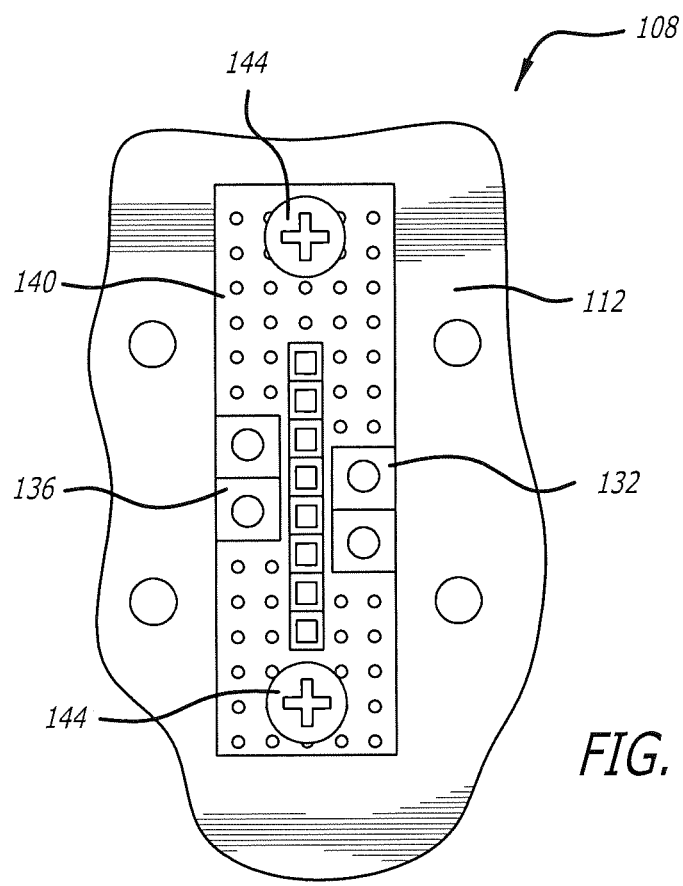
FIG. 4 illustrates a bottom view of a pleat detector comprising the pleat counter of FIG. 1.
Figure 5:
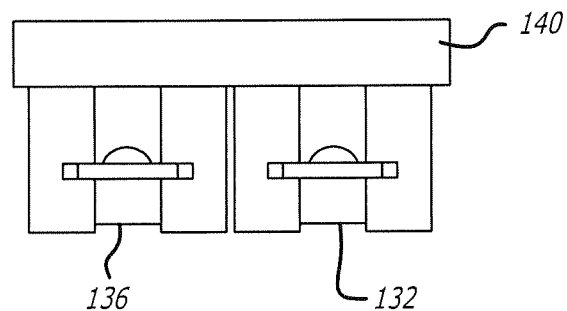
FIG. 5 illustrates a dimensioned side view of the pleat detector of FIG. 4.

FIG. 4 illustrates an exemplary embodiment of a pleat detector 108 comprising the pleat counter 100. The pleat detector 108 includes sensors 132, 136 mounted on a board 140. The sensors 132, 136 are configured to detect the presence of individual pleats comprising the sheet 104. As will be appreciated, the sensors 132, 136 may comprise any type of sensor capable of detecting corrugations in the sheet 104. Further, it is contemplated that the sensors 132, 136 may be advantageously positioned on the board 140 in a variety of configurations suitable for detecting the pleats, as shown in FIGS. 4-5. As shown in FIG. 4, the board 140 is attached to the mounting board 112 by way of hardware fasteners 144.

Figure 6:
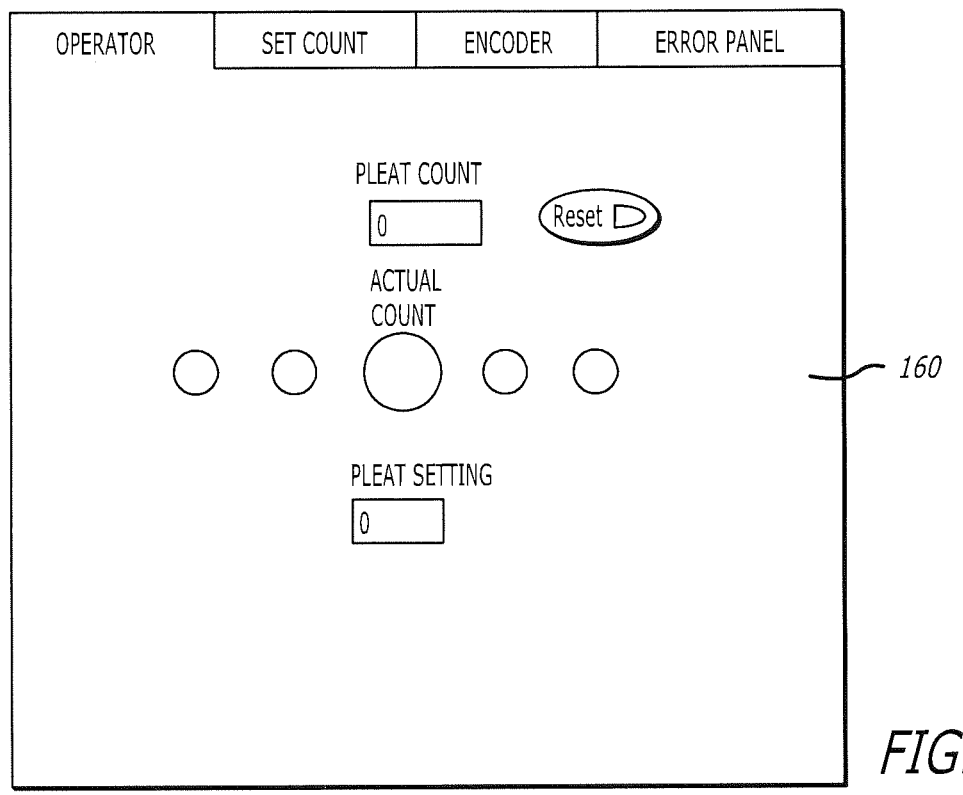
FIG. 6 illustrates an exemplary embodiment of an operator screen that may be presented to a practitioner by way of a computer.
Figure 7:
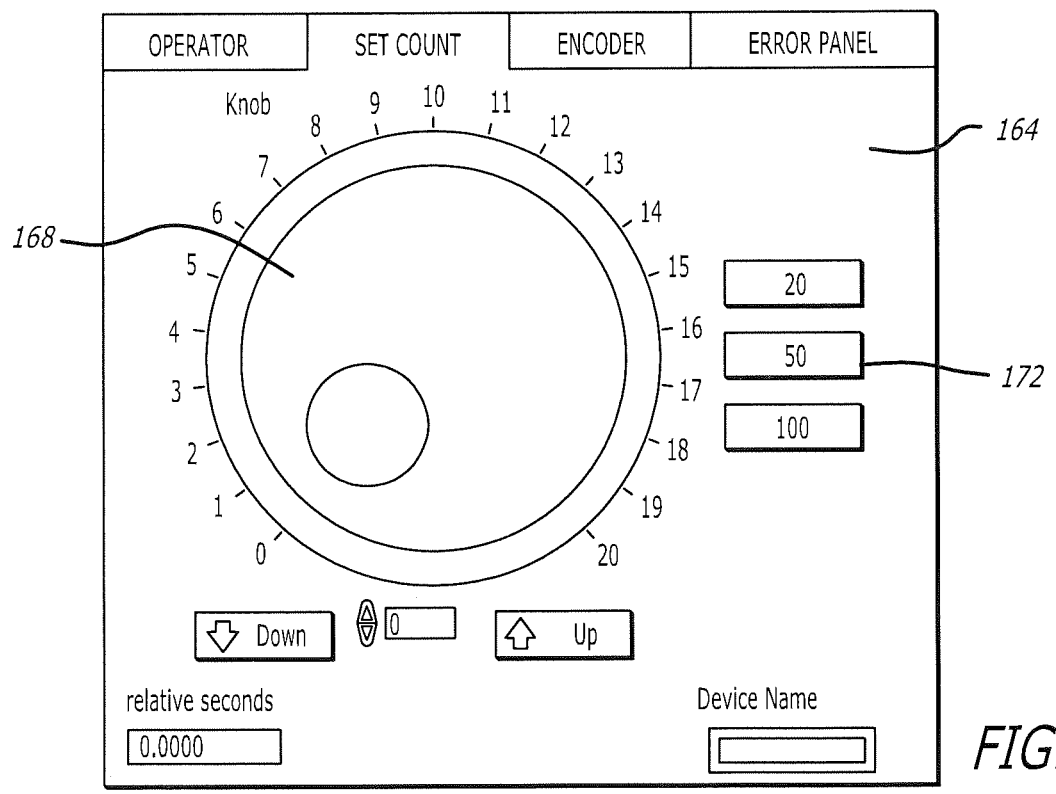
FIG. 7 illustrates an exemplary embodiment of a set count screen that may be displayed by way of a computer.
Figure 8:
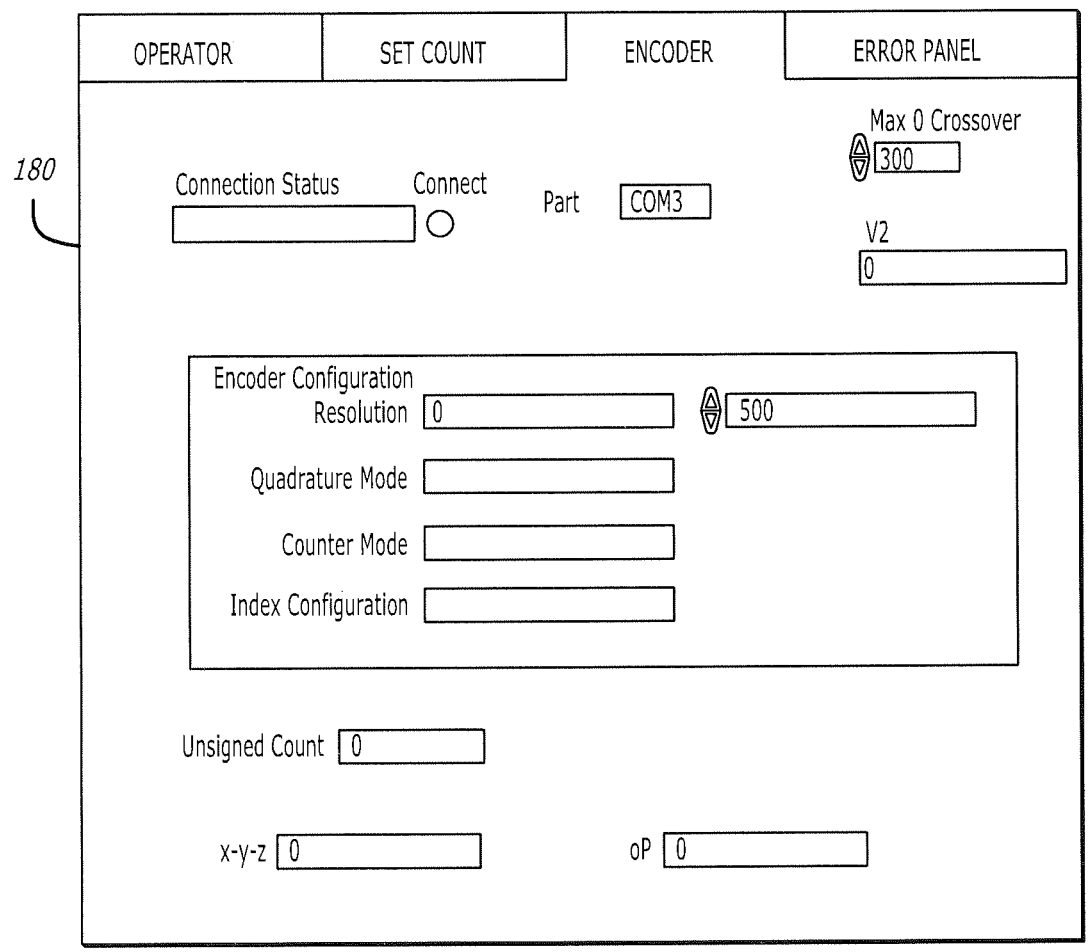
FIG. 8 illustrates an exemplary embodiment of an encoder screen that may be presented by way of a computer.

FIGS. 6-7 illustrates exemplary screens that may be presented to a practitioner by way of a computer during operating the pleat counter 100. For example, an exemplary embodiment of an operator screen 160 is shown in FIG. 6. The operator screen 160 may include graphical controls that enable a practitioner to observe the number of pleats detected in the sheet 104. FIG. 7 illustrates an exemplary embodiment of a set count screen 164 that may include graphical controls that enable the practitioner to select a number of pleats to include in a pleat interval. In the illustrated embodiment, the practitioner may select the number of pleats to include in a pleat interval by turning a dial 168 or by clicking on an interval button 172. Further, an exemplary encoder screen 180, shown in FIG. 8, include a variety of controls that generally enable the practitioner to calibrate the pleat counter 100 and its connection to the data processing system.

FIG. 9 is a block diagram illustrating an exemplary data processing system 900 that may be used with an automated pleat counter, such as the pleat counter 100 to perform any of the processes or methods described herein. System 900 may represent a desktop, a tablet, a server, a mobile phone, a media player, a personal digital assistant (PDA), a personal communicator, a network router or hub, a wireless access point (AP) or repeater, a set-top box, or a combination thereof.

In an embodiment, illustrated in FIG. 9, system 900 includes a processor 924 and a peripheral interface 928, also referred to as a chipset, to couple various components to the processor 924, including a memory 932 and devices 936-948 by way of a bus or an interconnect. Processor 924 may represent a single processor or multiple processors with a single processor core or multiple processor cores included therein. Processor 924 may represent one or more general-purpose processors such as a microprocessor, a central processing unit (CPU), and the like. More particularly, processor 924 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 924 may also be one or more special-purpose processors such as an application specific integrated circuit (ASIC), a field programmable gate array (FPGA), a digital signal processor (DSP), a network processor, a graphics processor, a network processor, a communications processor, a cryptographic processor, a co-processor, an embedded processor, or any other type of logic capable of processing instructions. Processor 924 is configured to execute instructions for performing the operations and steps discussed herein.

Peripheral interface 928 may include a memory control hub (MCH) and an input output control hub (ICH). Peripheral interface 928 may include a memory controller (not shown) that communicates with a memory 932. The peripheral interface 928 may also include a graphics interface that communicates with graphics subsystem 934, which may include a display controller and/or a display device. The peripheral interface 928 may communicate with the graphics device 934 by way of an accelerated graphics port (AGP), a peripheral component interconnect (PCI) express bus, or any other type of interconnects.

An MCH is sometimes referred to as a Northbridge, and an ICH is sometimes referred to as a Southbridge. As used herein, the terms MCH, ICH, Northbridge and Southbridge are intended to be interpreted broadly to cover various chips that perform functions including passing interrupt signals toward a processor. In some embodiments, the MCH may be integrated with the processor 924. In such a configuration, the peripheral interface 928 operates as an interface chip performing some functions of the MCH and ICH. Furthermore, a graphics accelerator may be integrated within the MCH or the processor 924.

Memory 932 may include one or more volatile storage (or memory) devices, such as random access memory (RAM), dynamic RAM (DRAM), synchronous DRAM (SDRAM), static RAM (SRAM), or other types of storage devices. Memory 932 may store information including sequences of instructions that are executed by the processor 924, or any other device. For example, executable code and/or data of a variety of operating systems, device drivers, firmware (e.g., input output basic system or BIOS), and/or applications can be loaded in memory 932 and executed by the processor 924. An operating system can be any kind of operating systems, such as, for example, Windows® operating system from Microsoft@, Mac OS®/iOS® from Apple, Android® from Google®, Linux®, Unix®, or other real-time or embedded operating systems such as VxWorks.

Peripheral interface 928 may provide an interface to I/O devices, such as the devices 936-948, including wireless transceiver(s) 936, input device(s) 940, audio I/O device(s) 944, and other I/O devices 948. Wireless transceiver 936 may be a WiFi transceiver, an infrared transceiver, a Bluetooth transceiver, a WiMax transceiver, a wireless cellular telephony transceiver, a satellite transceiver (e.g., a global positioning system (GPS) transceiver) or a combination thereof. Input device(s) 940 may include a mouse, a touch pad, a touch sensitive screen (which may be integrated with display device 934), a pointer device such as a stylus, and/or a keyboard (e.g., physical keyboard or a virtual keyboard displayed as part of a touch sensitive screen). For example, the input device 940 may include a touch screen controller coupled with a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

Audio I/O 944 may include a speaker and/or a microphone to facilitate voice-enabled functions, such as voice recognition, voice replication, digital recording, and/or telephony functions. Other optional devices 948 may include a storage device (e.g., a hard drive, a flash memory device), universal serial bus (USB) port(s), parallel port(s), serial port(s), a printer, a network interface, a bus bridge (e.g., a PCI-PCI bridge), sensor(s) (e.g., a motion sensor, a light sensor, a proximity sensor, etc.), or a combination thereof. Optional devices 948 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips.

Note that while FIG. 9 illustrates various components of a data processing system, it is not intended to represent any particular architecture or manner of interconnecting the components; as such details are not germane to embodiments of the present disclosure. It should also be appreciated that network computers, handheld computers, mobile phones, and other data processing systems, which have fewer components or perhaps more components, may also be used with embodiments of the invention disclosed hereinabove.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it should be appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system's memories or registers or other such information storage, transmission or display devices.

The techniques shown in the figures can be implemented using code and data stored and executed on one or more electronic devices. Such electronic devices store and communicate (internally and/or with other electronic devices over a network) code and data using computer-readable media, such as non-transitory computer-readable storage media (e.g., magnetic disks; optical disks; random access memory; read only memory; flash memory devices; phase-change memory) and transitory computer-readable transmission media (e.g., electrical, optical, acoustical or other form of propagated signals—such as carrier waves, infrared signals, digital signals).

The processes or methods depicted in the preceding figures may be performed by processing logic that comprises hardware (e.g. circuitry, dedicated logic, etc.), firmware, software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

While the invention has been described in terms of particular variations and illustrative figures, those of ordinary skill in the art will recognize that the invention is not limited to the variations or figures described. In addition, where methods and steps described above indicate certain events occurring in certain order, those of ordinary skill in the art will recognize that the ordering of certain steps may be modified and that such modifications are in accordance with the variations of the invention. Additionally, certain of the steps may be performed concurrently in a parallel process when possible, as well as performed sequentially as described above. To the extent there are variations of the invention, which are within the spirit of the disclosure or equivalent to the inventions found in the claims, it is the intent that this patent will cover those variations as well. Therefore, the present disclosure is to be understood as not limited by the specific embodiments described herein, but only by scope of the appended claims.

What is claimed is:

1. A pleat counter, comprising:
a mounting board for supporting one or more sensors;
a pleat detector configured to identify a target pleat count for counting a number of pleats comprising a corrugated sheet of filter material whereby the pleat detector is mounted underneath the mounting board;
the pleat detector comprising a pleat counter and a plurality of sensors configured to detect the presence of individual pleats;
a data processing system coupled to the pleat detector;
a set count screen that includes graphical controls that enable the selection of a number of pleats to include in a pleat interval; and
an interface for coupling the pleat counter with the data processing system.

2. The pleat counter of claim 1, wherein the pleat detector is mounted underneath the mounting board for the purpose of counting the number of pleats comprising the corrugated sheet of filter material.

3. The pleat counter of claim 2, wherein the mounting board is configured to position the pleat detector adjacent to the corrugated sheet of filter material.

4. The pleat counter of claim 3, wherein the pleat counter is configured to remain in a stationary disposition while the corrugated sheet of filter material is steadily translated nearby the pleat detector, such that the pleats passing by the detector are detectable.

5. The pleat counter of claim 1, wherein the data processing system comprises any of a desktop, a tablet, a server, a mobile phone, a media player, a personal digital assistant, a personal communicator, a network router or hub, a wireless access point or repeater, a set-top box, or a combination thereof.

6. The pleat counter of claim 5, wherein wiring and one or more circuit boards are configured to communicate electrical signals between the interface and the pleat detector.

7. The pleat counter of claim 6, wherein the one or more circuit boards are configured to translate the electrical signals provided by the pleat detector into signals that are recognizable by the data processing system.

8. The pleat counter of claim 1, wherein the pleat detector includes one or more sensors configured to detect the presence of individual corrugations comprising the corrugated sheet of filter material.

9. The pleat counter of claim 8, wherein the one or more sensors comprise any type of sensor capable of detecting the individual corrugations.

10. The pleat counter of claim 9, wherein the one or more sensors may be orientated in a variety of configurations suitable for detecting the individual corrugations.

11. A method for a pleat counter, comprising:
obtaining a mounting board configured to support one or more sensors;
configuring a pleat detector comprising a pleat counter and a plurality of sensors configured to detect the presence of individual pleats for counting a number of pleats comprising a corrugated sheet of filter material;
mounting the pleat detector onto the mounting board;
coupling a data processing system with the pleat counter;
a set count screen that includes graphical controls that enable the selection of a number of pleats to include in a bleat interval; and
translating a corrugated filter material nearby the pleat counter.

12. The method of claim 11, wherein coupling includes providing the data processing system in the form of any of a desktop, a tablet, a server, a mobile phone, a media player, a personal digital assistant, a personal communicator, a network router or hub, a wireless access point or repeater, a set-top box, or a combination thereof.

13. The method of claim 11, wherein coupling includes configuring wiring and one or more circuit boards to communicate electrical signals between the pleat detector and an interface connected to the data processing system.

14. The method of claim 13, wherein configuring the one or more circuit boards includes translating the electrical signals provided by the pleat detector into signals that are recognizable by the data processing system.

15. The method of claim 11, wherein configuring the pleat detector includes configuring one or more sensors to detect the presence of individual corrugations comprising the corrugated sheet of filter material.

16. The method of claim 15, wherein mounting the pleat detector includes orientating the one or more sensors in a configuration suitable for detecting the individual corrugations.

17. The method of claim 11, wherein mounting the pleat detector includes mounting the pleat counter underneath the mounting board for the purpose of counting a number of pleats comprising the corrugated sheet of filter material.

18. The method of claim 11, wherein translating the corrugated filter material includes configuring the pleat counter to remain in a stationary disposition while the corrugated sheet of filter material passes by the pleat detector.

* * * * *